United States Patent [19]

Williams et al.

[11] Patent Number: 5,451,533

[45] Date of Patent: Sep. 19, 1995

[54] BIDIRECTIONAL BLOCKING LATERAL MOSFET WITH IMPROVED ON-RESISTANCE

[75] Inventors: Richard K. Williams, Cupertino; Kevin Jew, Fremont; Jun W. Chen, Saratoga, all of Calif.

[73] Assignee: Siliconix incorporated, Santa Clara, Calif.

[21] Appl. No.: 318,323

[22] Filed: Oct. 5, 1994

Related U.S. Application Data

[62] Division of Ser. No. 160,539, Nov. 30, 1993.

[51] Int. Cl.6 .......................................... H01L 21/265
[52] U.S. Cl. ................................. 437/41; 437/6;
437/29; 437/44; 437/45; 437/913; 148/DIG. 126; 257/392; 257/402
[58] Field of Search .................. 437/6, 45, 29, 41, 44, 437/913; 257/392, 402, 655; 148/DIG. 126, DIG. 96

[56] References Cited

U.S. PATENT DOCUMENTS

| | | | |
|---|---|---|---|
| 4,626,879 | 12/1986 | Colak | 357/23.4 |
| 4,895,520 | 1/1990 | Berg | 437/45 |
| 4,902,636 | 2/1990 | Akiyama et al. | 437/45 |
| 4,916,085 | 4/1990 | Frisina | 437/45 |
| 5,086,332 | 2/1992 | Nakagawa et al. | 357/51 |
| 5,171,703 | 12/1992 | Lin et al. | 437/61 |
| 5,179,032 | 1/1993 | Quigg | 437/29 |
| 5,179,034 | 1/1993 | Mori et al. | 437/41 |
| 5,202,276 | 4/1993 | Malhi | 437/44 |
| 5,248,627 | 9/1993 | Williams | 437/45 |
| 5,288,653 | 2/1994 | Enjoh | 437/29 |
| 5,313,082 | 5/1994 | Eklund | 257/262 |
| 5,357,120 | 10/1994 | Mori | 257/38 |

*Primary Examiner*—Olik Chaudhuri
*Assistant Examiner*—Long Pham
*Attorney, Agent, or Firm*—Skjerven, Morrill, MacPherson, Franklin & Friel; David E. Steuber

[57] ABSTRACT

A bidirectional current blocking lateral power MOSFET including a source and a drain which are not shorted to a substrate, and voltages that are applied to the source and drain are both higher than the voltage at which the body is maintained (for an N-channel MOSFET) or lower than the voltage at which the body is maintained (for a P-channel MOSFET). The on-resistance of the MOSFET is improved by decreasing the conductance of the epi region and disposing a thin threshold adjust layer on the surface of the substrate between the source and drain regions. An optional second punchthrough preventing implant is disposed on the substrate surface.

8 Claims, 13 Drawing Sheets

BIDIRECTIONAL BLOCKING LATERAL MOSFET WITH IMPROVED ON-RESISTANCE

This application is a division of application Ser. No. 08/160,539, filed Nov. 30, 1993, Pending.

CROSS REFERENCE TO RELATED APPLICATION

This application is related to application Ser. No. 08/159,900 and application Ser. No. 08/160,560, both of which were filed on the same date as this application, and both of which are incorporated herein by reference.

FIELD OF THE INVENTION

This invention relates to a bidirectional current blocking power MOSFET and in particular to a bidirectional current blocking MOSFET with improved on-resistance and a method for improving the on-resistance of a bidirectional current blocking MOSFET.

BACKGROUND

Users of battery-powered devices such as notebook computers require that the devices be usable for long periods of time between battery recharges. This requirement has led to cascaded battery arrangements, in which a primary battery, a secondary battery, etc., are connected to the device in succession. Frequently an AC/DC converter is also provided to allow the user to conserve battery power when the user is near a source of AC power. A connection for an external backup battery may also be provided.

Such an arrangement is illustrated in FIG. 1 wherein a primary battery B1 and a secondary battery B2 are connected via switches S1 and S2, respectively, to a load L, which could be a DC/DC converter supplying, for example, a notebook computer. The supply connections are made through a bus which is designated B, which is maintained at a voltage $V_{bus}$.

Also connected to bus B is an AC/DC converter C3 which supplies power through a switch S3. The voltage supplied by primary battery B1 is designated $V_1$, the voltage supplied by secondary battery B2 is designated $V_2$, and the voltage supplied by AC/DC converter C3 is designated $V_3$. A backup battery B4 is also connected to bus B.

In the operation of this multiple battery arrangement, only one of switches S1, S2, and S3 would normally be closed. The remaining switches would be open. When power is supplied to the bus B by primary battery B1, for example, switch S1 is closed and switches S2 and S3 are open.

As the power sources are switched in and out, the voltage across switches S1, S2, and S3 can vary both in magnitude and direction. This is illustrated in FIGS. 2A-2C. As shown in FIG. 2A, the output $V_2$ of battery B2 might be 14 V at a given point in time. If battery B2 is then supplying power, the voltage $V_{bus}$ would also equal 14 V. If battery B1 is fully charged, its output voltage $V_1$, might be 18 V. In this case, the left side of switch S1 would be positively charged relative to the right side. On the other hand, assume the same situation except that battery B1 is discharged, so that $V_1$, is 6 V. In this case, the right side of switch S1 is positively charged relative to the left side, as shown in FIG. 2B. A third alternative is illustrated in FIG. 2C where battery B1 is discharged, battery B2 is fully charged, and bus B is supplied by converter C1. In the example, $V_1$ is 6 V, $V_2$ is 17 V, and $V_3$ is 12 V. In this case, the right side of switch S1 is positively charged with respect to the left side of switch S1, and the left side of switch S2 is positively charged.

In summary, any of switches S1-S3 may have to withstand a voltage in either direction. The only thing known for certain is that all of the voltages applied to these switches will be above ground.

The device may also be equipped with an internal battery charger, as illustrated in FIG. 3. A battery charger C5 is connected to battery B1 via a switch S4 and to battery B2 via a switch S5. Battery charger C5 may be supplied from the output of AC/DC converter C3 or (optionally) directly from the power main. As illustrated in FIG. 4, battery charger C5 may deliver a voltage as high as 24 V for quick battery charging. In the condition illustrated in FIG. 4, battery B2 is being charged, and the $V_1$ output of battery B1 is equal to 12 volts. Switch S4 therefore must withstand a voltage difference of 12 V. However, since deep discharging of a rechargeable battery is known to extend its life, $V_1$ is often allowed to drop below 6 V, in which case switch S4 would need to withstand over 18 V, with its left side being positively charged. On the other hand, when battery charger C5 is not operative it may have a shorted or leaky characteristic, and switches S4 and S5 would have to block voltages in the other direction. Therefore, switches S4 and S5 must also have a bidirectional current blocking capability.

The foregoing would not represent a problem if switches S1-S5 were mechanical switches. It is preferable to use semiconductor technology, and in particular MOSFET technology, in fabricating these switches. Power MOSFETs are typically fabricated with a source-body short to ensure that the intrinsic bipolar transistor (formed by the source, body and drain regions) remains turned off at all times. The prior art teaches generally that a good source-body short is fundamental to reliable parasitic-bipolar-free power MOSFET operation.

The use of a source-body short has the effect of creating a diode across the drain and body terminals of a MOSFET which is electrically in parallel with the MOSFET. For a P-channel device, the cathode of the diode is connected to the drain; for an N-channel device, the anode of the diode is connected to the drain. Thus, a MOSFET must never be exposed to voltages at its source-body and drain terminals which would cause the "antiparallel" diode to become forward-biased. FIGS. 5A-5D illustrate the polarity of the antiparallel diode (shown in hatched lines) for a vertical N-channel DMOS device (FIG. 5A), a vertical P-channel DMOS device (FIG. 5B), a lateral N-channel device (FIG. 5C), and a lateral N-channel DMOS device (FIG. 5D).

Accordingly, conventional MOSFETs are not suitable for switches S1-S5 because they are not capable of blocking bidirectional currents. In FIGS. 2A-2C, for example, the antiparallel diodes across switches S1 and S2 are shown in hatched lines, with the antiparallel diodes directed as would be required to block the flow of current through the switches. If the polarity of the voltages across the switches were reversed, it is clear that the antiparallel diodes would become forward-biased.

One possible solution to this problem would be to connect two MOSFETs in a back-to-back arrangement, as illustrated in FIGS. 6A-6C. FIG. 6A illustrates a pair of NMOS devices having a common source, FIG. 6B illustrates a pair of NMOS devices having a common drain, and FIG. 6C illustrates a pair of PMOS devices having a common source. These back-to-back arrangements double the on-resistance of the devices, however, and therefore significant detract from the amount of power delivered to the computer or other instrument.

Accordingly, what is needed is a bidirectional current blocking MOSFET having an on-resistance which is comparable with a normal MOSFET.

SUMMARY OF THE INVENTION

In accordance with the present invention, a bidirectional current blocking lateral MOSFET includes a substrate having a P+ body region, a P− epi region, a source region and a drain region formed in the epi region, an oxide layer formed on a surface of the substrate and a gate formed on the oxide layer. The source and body regions are not shorted together, and voltages that are applied to the source and drain regions are both higher than the voltage at which the body is maintained (for an N-channel MOSFET) or lower than the voltage at which the body is maintained (for a P-channel MOSFET). The on-resistance of the MOSFET is improved by decreasing the conductance of the epi region and disposing a thin threshold adjust layer on the surface of the substrate between the source and drain regions.

In accordance With another embodiment of the present invention, a second punchthrough preventing implant is disposed on the substrate surface.

In accordance with another embodiment of the present invention, a method for producing a bidirectional current blocking MOSFET includes the steps of forming a P− epi layer in a P+ substrate, disposing a P type adjust layer onto a surface of the substrate, and then forming N+ source and drain regions in the P− epi layer, wherein the P type adjust layer has a dopant concentration between the concentrations of the P− epi layer and the P+ body region. The method also includes the steps of forming an oxide layer on the P type adjust layer and forming a gate on the oxide layer.

In accordance with another aspect of the present invention, a second P− type adjust layer is formed on the P type adjust layer to prevent punchthrough in MOSFETs in which the P− epi layer is below a predetermined minimum.

DESCRIPTION OF INVENTION

Bidirectional Blocking MOSFET Structure

Figure 1:
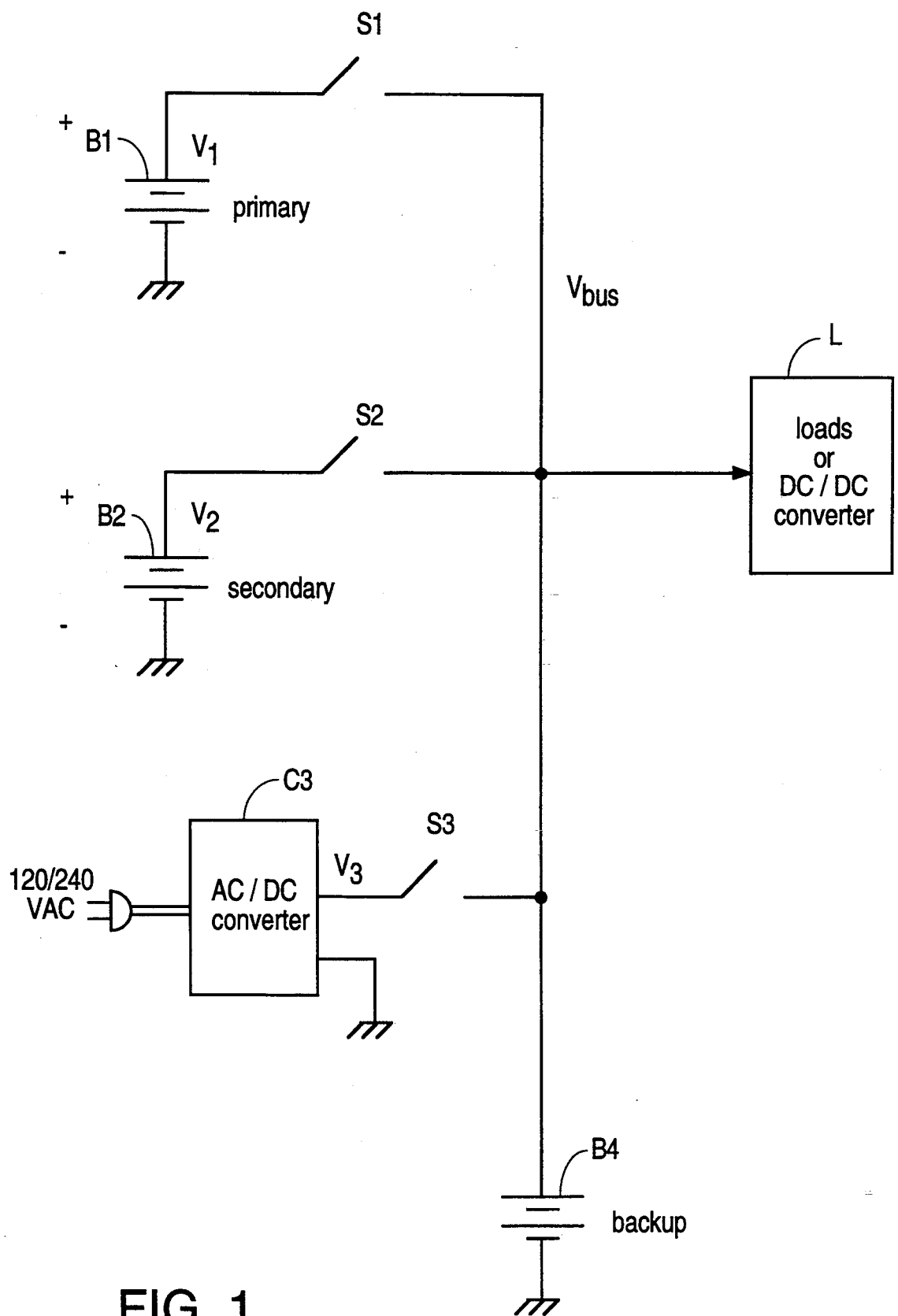
FIG. 1 illustrates a schematic drawing of a multiple battery power supply arrangement, including disk connect switches.
Figure 2A:
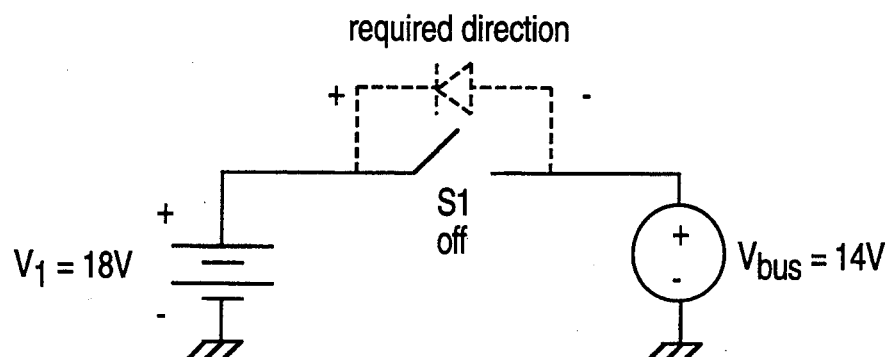
FIGS. 2A, 2B and 2C illustrate possible voltage differences illustrated by the disk connect switches shown in FIG. 1.
Figure 2B:
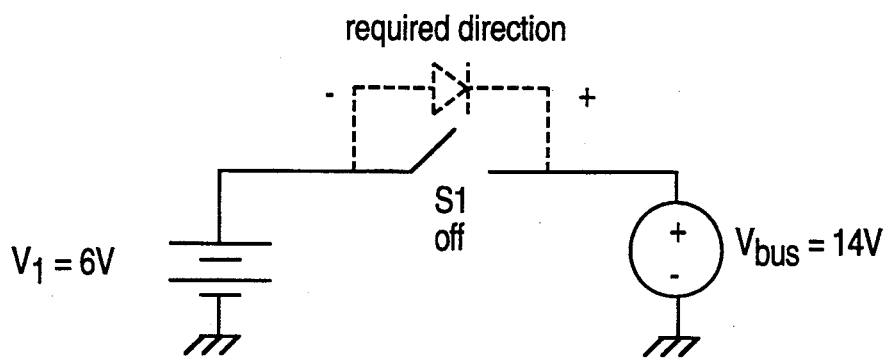
Figure 2C:
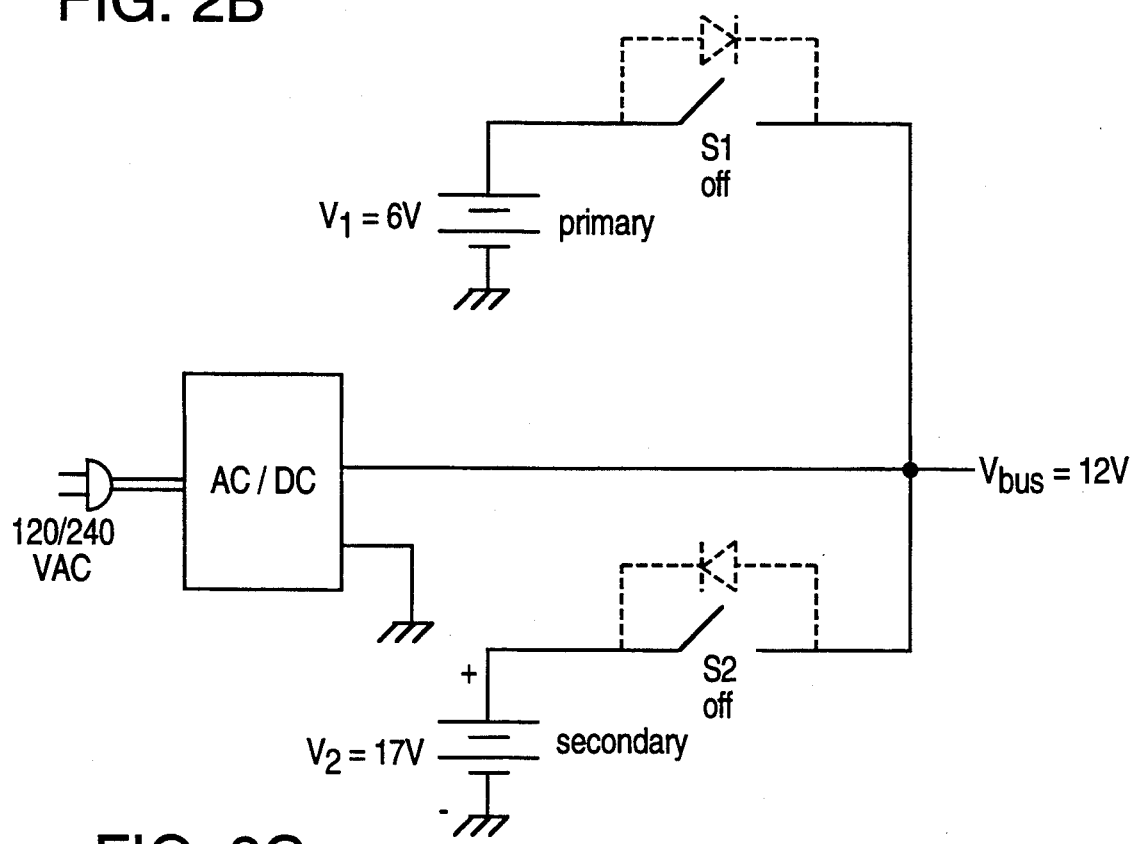
Figure 3:
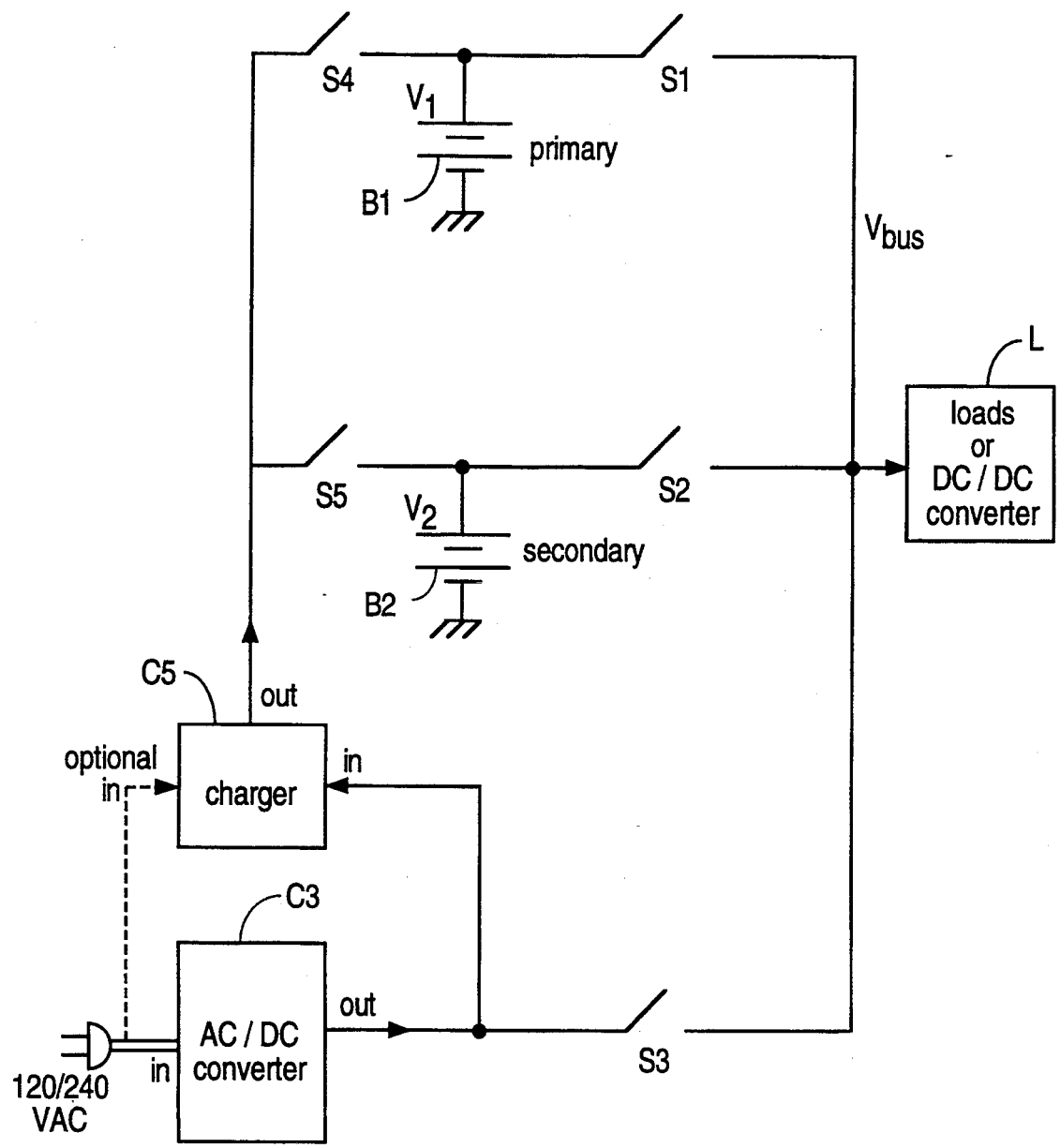
FIG. 3 illustrates a schematic diagram of a multiple battery power supply arrangement, including a battery charger.
Figure 4:
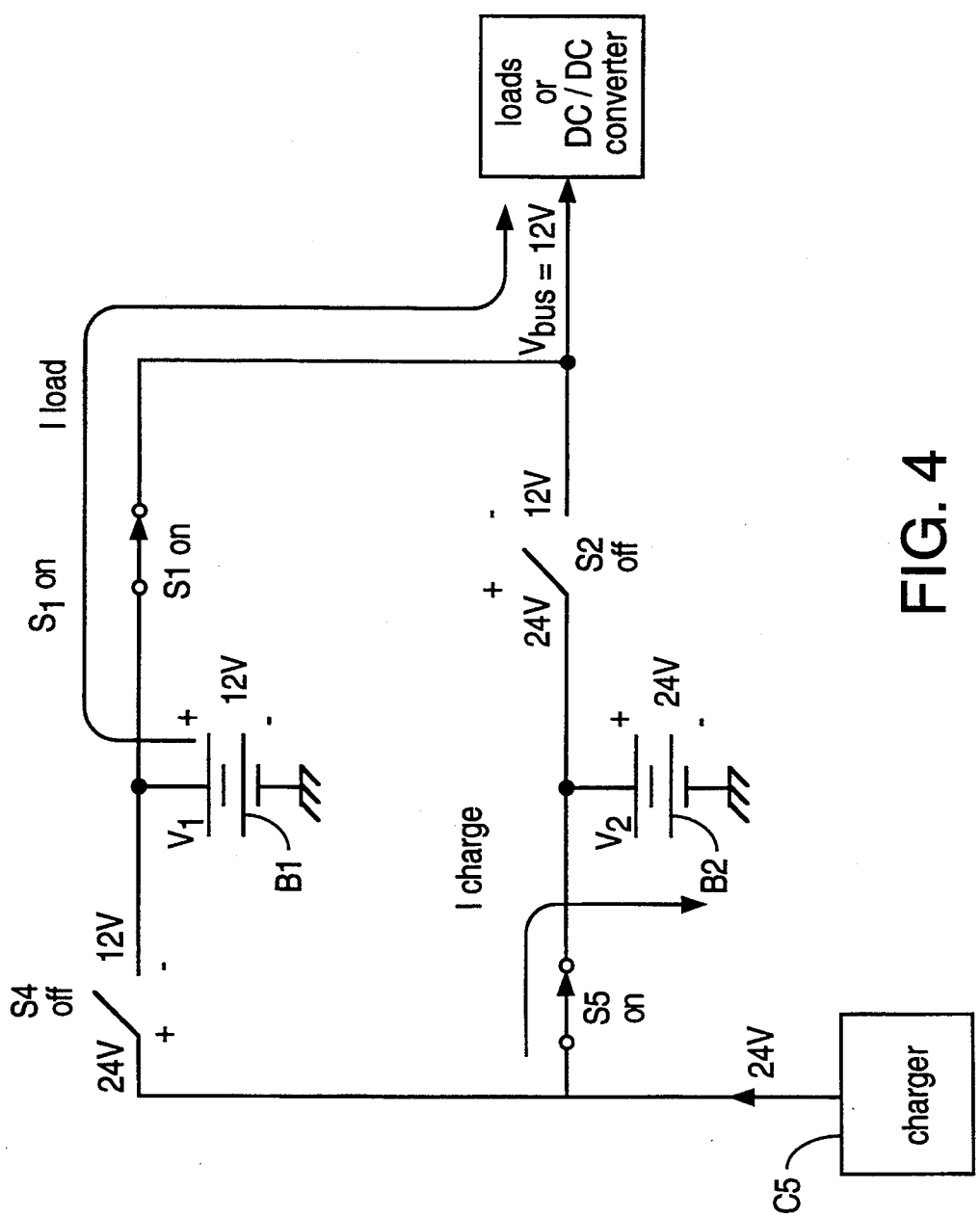
FIG. 4 illustrates possible voltage differences experienced by the disconnect switches shown in FIG. 3.
Figure 5A:
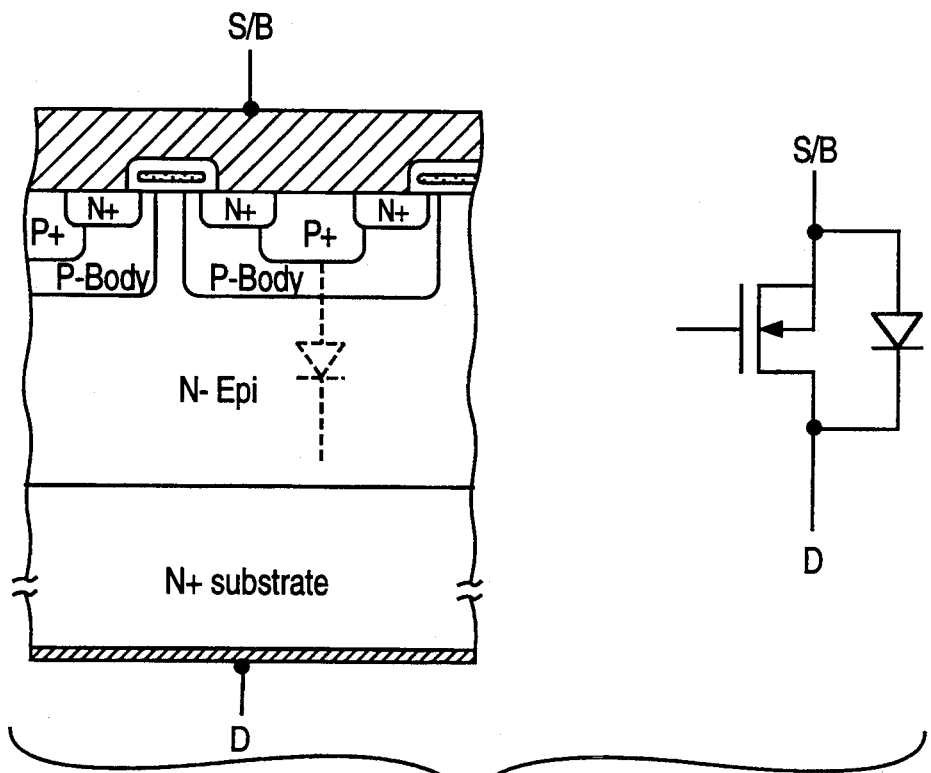
FIGS. 5A–5D illustrate, respectively, a vertical N-channel double-diffused MOSFET, a vertical P-channel double-diffused MOSFET, a lateral N-channel MOSFET, and a lateral N-channel double-diffused MOSFET, all of which contain a source-body short.
Figure 5B:
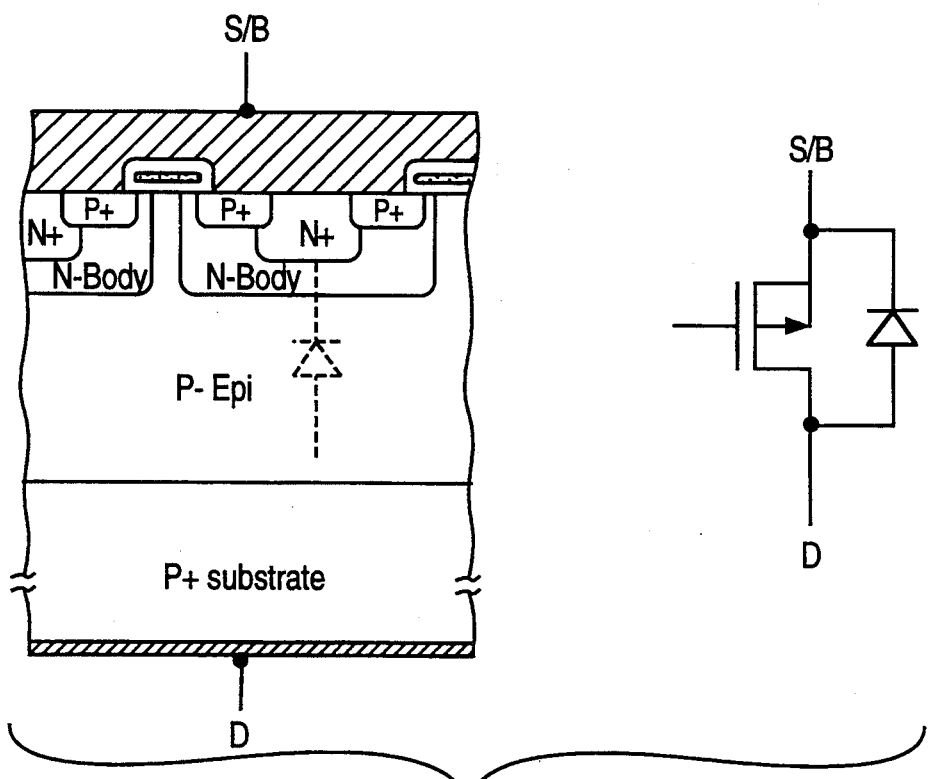
Figure 5C:
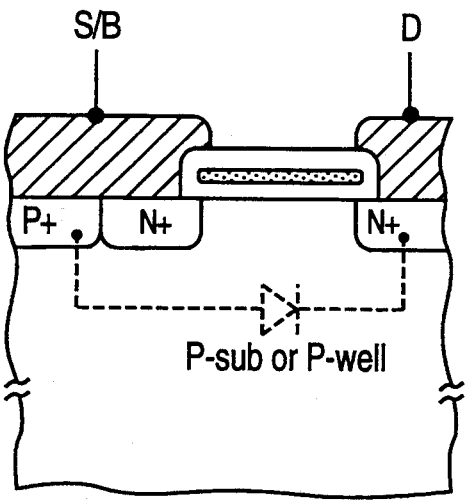
Figure 5C:
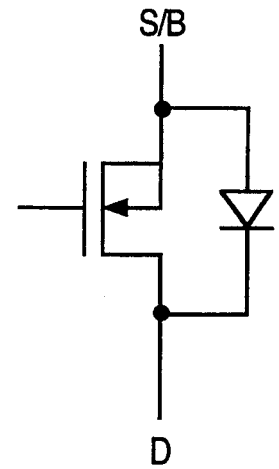
Figure 5D:
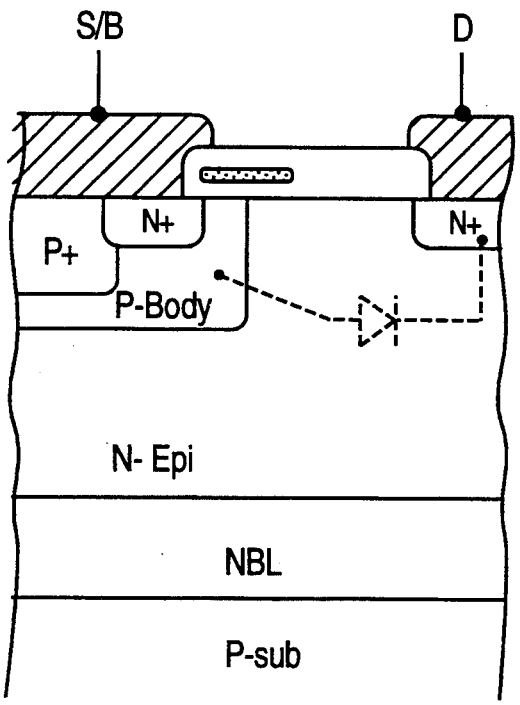
Figure 5D:
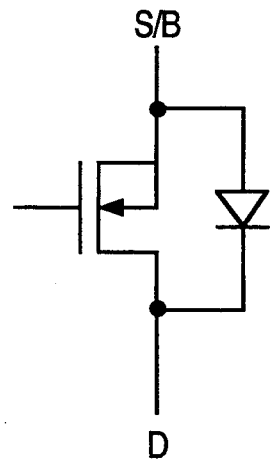
Figure 6A:
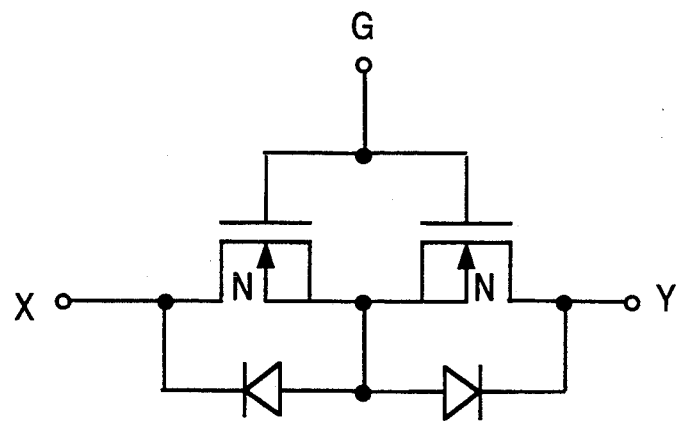
FIGS. 6A–6C illustrate bidirectional current blocking switches consisting of back-to-back MOSFETs.
Figure 6B:
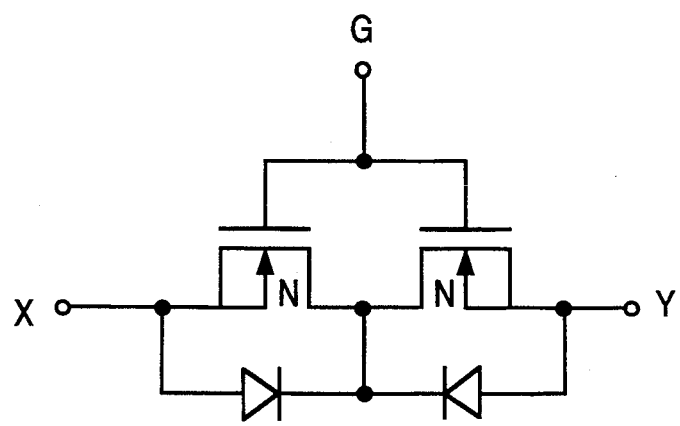
Figure 6C:
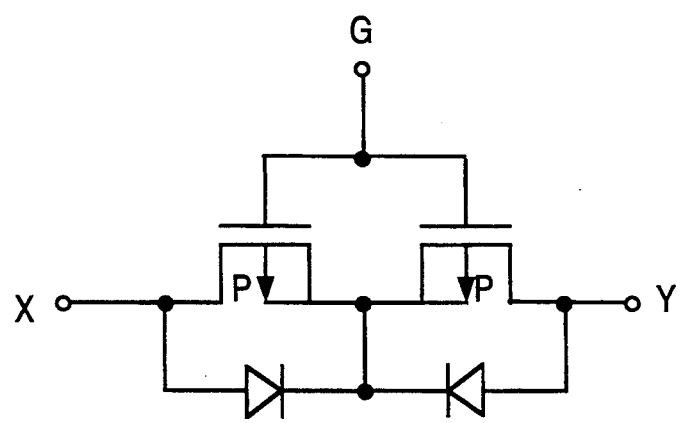
Figure 7:
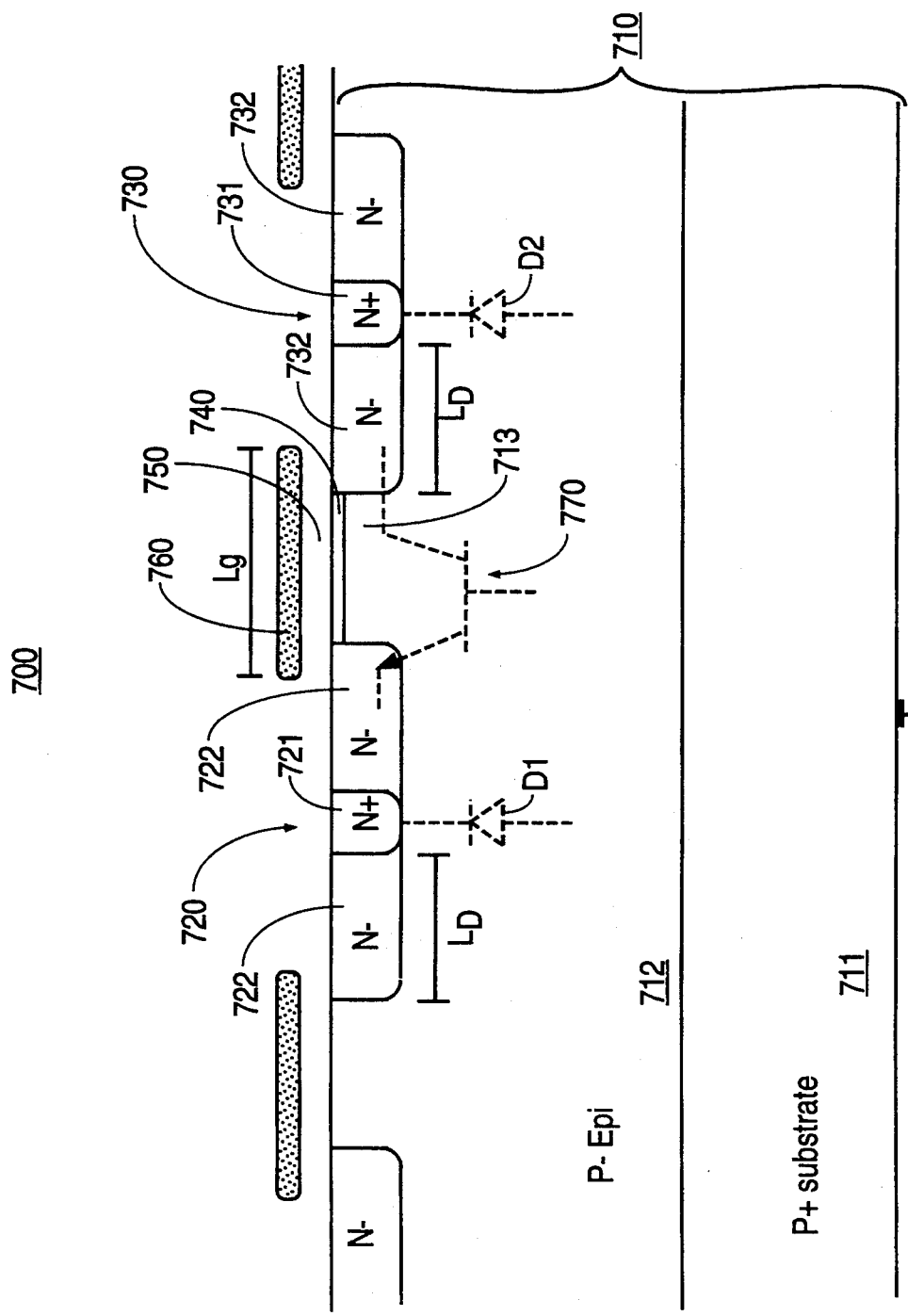
FIG. 7 illustrates a section view of one cell of a bidirectional blocking MOSFET according to the present invention.

FIG. 7 illustrates a cross section of a single cell of a bidirectional current blocking MOSFET 700 in accordance with the present invention. MOSFET 700 is preferably cellular with alternating source and drain regions in each poly gate opening, although a stripe geometry can be used.

In the embodiment shown in FIG. 7, MOSFET 700 includes a substrate 710 which includes a P+ body region 711. A P− epitaxial (epi) region 712 overlies the P+ body region 711. A P type threshold adjust implant layer 740, described further below, is formed on a surface of epi region 712 for adjusting the threshold voltage of MOSFET 700 and for preventing punchthrough. Formed in epi region 712 are a source 720 having an N+ region 721 and an N-(drifted) region 722, and a drain 730 having an N+ region 731 and an N− (drifted) region 732. The junction between source region 720 and drain region 730, respectively, and epi region 711 are indicated by intrinsic diodes D1 and D2. A channel region 713 is formed by a portion of epi region 712 and is located between source 720 and drain 730. Finally, an oxide layer 750 is formed on the surface of epi region 712, and a polysilicon gate 760 is formed on oxide layer 750.

Note that MOSFET 700 is symmetric because neither source 720 nor drain 730 is shorted to body region 711. That is, for an N-channel MOSFET 700, drain 730 can be maintained at a higher voltage than source 720, provided that both source 720 and drain 730 are above a voltage level of body region 711. Similarly, for a P-channel MOSFET 700, drain 730 can be maintained at a lower voltage than source 720, provided that both source 720 and drain 730 are below a voltage level of body region 711. Therefore, as used in the discussion below, the terms "source" and "drain" are understood as arbitrarily indicating the more negative and more positive, respectively, of N-type regions 720 and 730.

Substrate 710 is a silicon wafer having a minimum thickness of 350 μm (for a 150 mm wafer size) and preferably a (100) orientation. Substrate 710 has a resistivity below 0.03 ohm-cm, with 0.005 ohm-cm being preferred for a backside contact. Epi region 712 has a resistivity in the range between 2 to 20 ohm-cm, depending upon the formation of threshold adjust implant 740 (discussed below), with 3 ohm-cm being typical. The thickness of P− epi region 712 is around to 1 to 3 μm after P+ substrate updiffusion, meaning that its initial thickness as grown is around 4 to 8 μm.

In the preferred embodiment, N+ source region 721 and N+ drain region 731 are approximately 2 to 6 μm wide, and have a resistance of approximately 20 to 25 ohms/cm². Symmetrical drift regions 722 and 732 are employed to support large source-to-drain voltages. Both source drift region 722 and drain drift region 732 have a length $L_D$ which is between 1 and 4 μm, with 2 μm being preferable for a bidirectional MOSFET capable of blocking 35 volts in a fully-off state. These drift dimensions are outside the range of sidewall spacer oxides and must therefore must be defined by an N+ implant mask. The resistance of the drift regions 722 and 732 is between 500 and 5000 ohms/cm², with 1000 ohms/cm² being preferred. In a P-channel embodiment of the present invention, the resistance of the drift regions is approximately 2.5 times that of the above-described N-channel embodiment.

P type threshold adjust implant layer 740 is formed on the top surface of epi region 712. Doping concentrations and implant depths of threshold adjust implant layer 740 are determined by on-resistance optimization considerations, discussed below.

Gate oxide layer 750 has a thickness which is determined by the maximum gate-to-source voltage supported across gate oxide layer 750. As described in co-pending application Ser. No. 08/160,560, gate oxide layer 750 must typically support up to 10 volts for a floating voltage gate drive circuit, and commonly 15 volts or more (and possibly as much as 30 volts) for a fixed voltage gate drive circuit. Assuming a SiO₂ breakdown of 8 MV/cm and a 50% derating, the thickness of oxide layer 750 can be determined using a voltage-to-thickness ratio of 40 V/1000 Å. For example, a 400 Å gate oxide layer 750 could be rated for 16 volt operation, and a 700 Å gate oxide layer 750 for around 28 volts. For thinner gate oxide layers, the critical field improves somewhat, meaning 200 Å gate oxide layer can probably be rated for 10 volts (instead of 8 volts).

Gate 760 should have a length Lg which avoids source-to-drain punchthrough while minimizing channel resistance. For MOSFET 700, the length Lg is typically in the range of 1 to 4 μm, with 2 μm being preferable for operation in the 18 to 24 volt range.

The operating (source-to-drain) voltage of MOSFET 700 depends not only the off-state blocking capability of MOSFET 700, but on the suppression of a parasitic NPN bipolar transistor 770 formed in MOSFET 700 with source 720 as an emitter, epi region 712 and P+ substrate 710 as a base and drain 730 as a collector. The orientation of parasitic bipolar transistor 770 is dependent upon the relative voltages of source 720 and drain 730. As discussed below, parasitic bipolar transistor 770 is suppressed through a proper combination of the doping level of epi region 712 and threshold adjust implant layer 740.

On-Resistance Optimization

Reduction of the on-resistance of MOSFET 700 in accordance with the present invention is achieved by decreasing the doping concentration of epi region 712, and compensating for the resulting reduction in threshold voltage by forming threshold adjust implant layer 740, which has a higher doping concentration than epi region 712, along the top surface of epi region 712. This dopant profile optimization differs from conventional power MOSFET technology (including that of double-diffused MOSFETs, or "DMOS") in that its purpose is to minimize on-resistance under conditions of large body effects, i.e., where the source-to-body voltage is significantly more than 1 volt. As used herein, "on-resistance" is defined as the drain-to-source resistance $R_{ds}$ measured from source 720 to drain 730 when MOSFET 700 is turned-on; that is, when an applied gate-to-source voltage $V_{gs}$ is equal to or greater than the threshold voltage $V_t$ of MOSFET 700.

Referring to FIG. 7, when MOSFET 700 is turned on, the steady state drain-to-source voltage $V_{ds}$ depends on the current level between drain 730 and source 720 and, most importantly on the on-resistance $R_{ds}$ of MOSFET 700. The on-resistance $R_{ds}$ is determined by the magnitude of the body effect γ of MOSFET 700, the body effect γ being defined as the shift in threshold voltage $V_t$ caused by the magnitude of the source-to-body voltage $V_{sb}$. Assuming a uniform background doping, the threshold voltage $V_t$ at any given source-to-body voltage V,b can be approximated by:

$$V_t = V_{to} + \gamma \sqrt{V_{sb}} \qquad \text{(Eq. 1)}$$

where $V_{to}$ is the threshold voltage when the source-to-body voltage is zero. In addition, the on-resistance $R_{ds}$ can be approximated by:

$$R_{ds} = \frac{L}{W\mu C_{ox}} \cdot \frac{1}{(V_{gs} - V_t)} \qquad \text{(Eq. 2)}$$

where L and W are the length and width of the channel region 713, μ is electron mobility, $C_{ox}$ is the capacitance of the gate oxide layer 750 given by the well-known relationship $C_{ox} = \epsilon_{ox}/X_{ox}$ where $\epsilon_{ox}$ is the relative permittivity of the gate oxide and $X_{ox}$ is the gate oxide thickness, and $V_{gs}$ is the gate-to-source voltage. Combining Eq. 1 and Eq. 2, the on-resistance $R_{ds}$ can be represented by:

$$R_{ds} = \frac{L}{W\mu C_{ox}} \cdot \frac{1}{(V_{gs} - V_{to} - \gamma \sqrt{V_{sb}})} \qquad \text{(Eq. 3)}$$

The body effect γ is determined by the gate oxide thickness $X_{ox}$ and background concentration $N_{epi}$, and can be expressed as:

$$\gamma = \frac{\sqrt{2q\epsilon_{si}N_{epi}}}{C_{ox}} = \frac{X_{ox}\sqrt{2q\epsilon_{si}N_{epi}}}{\epsilon_{ox}} \qquad \text{(Eq. 4)}$$

where q is electron charge (1.6×10⁻⁹ coulombs), and $\epsilon_{si}$ is the relative permittivity of the channel region.

Eq. 4 shows that any increase in the thickness $X_{ox}$ of gate oxide 750 or increase in the doping concentration $N_{epi}$ of epi region 712 will increase the body effect γ, thereby leading to a higher threshold voltage $V_t$ and on-resistance $R_{ds}$, as shown in Eq. 3. However, a decrease in the thickness $X_{ox}$ of gate oxide 750 or the doping concentration $N_{epi}$ of the P− epi region 712 cannot be attained without additional modifications to MOSFET 700 since a minimum $N_{epi}$ is required to prevent punchthrough and a minimum oxide thickness $X_{ox}$ is needed to support the maximum applied gate drive voltage $V_{gs}$.

In accordance with the present invention, reduced on-resistance $R_{ds}$ is achieved by thinning the gate oxide to a minimum thickness that still supports the desired gate drive voltage (typically 4 to 15 volts) and by decreasing the doping concentration $N_{epi}$ (of the P type epi layer 712) and preventing punchthrough by adding P type threshold adjust implant layer 740. The effect of threshold adjust implant layer 740 will now be described.

Figure 8A:
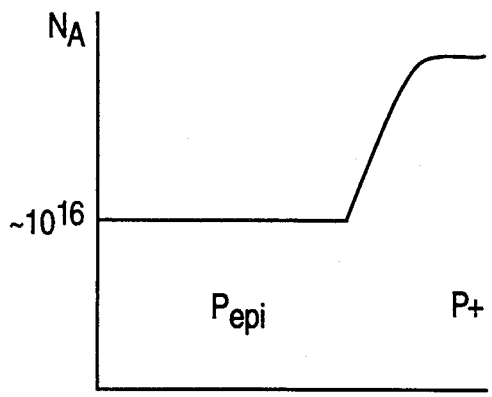
FIGS. 8A–8D illustrate threshold doping profiles for devices having differing on-resistance characteristics.
Figure 8B:
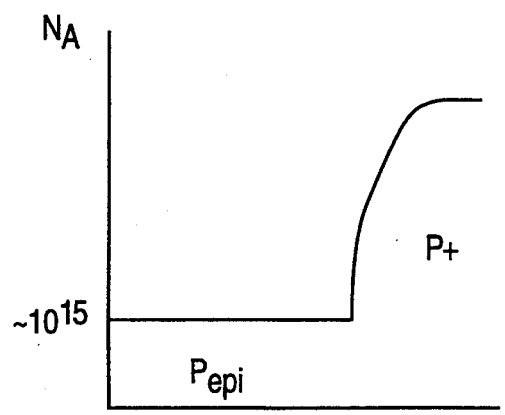
Figure 8C:
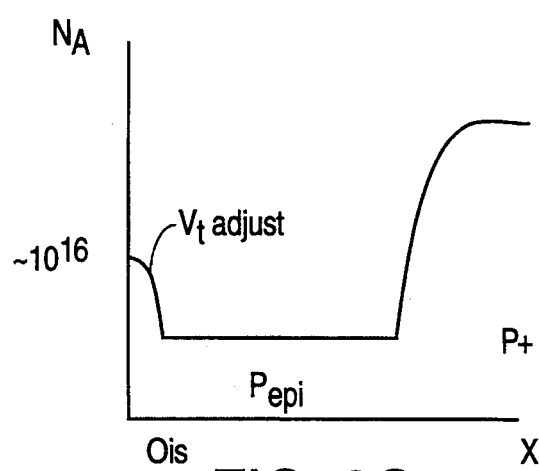
Figure 8D:
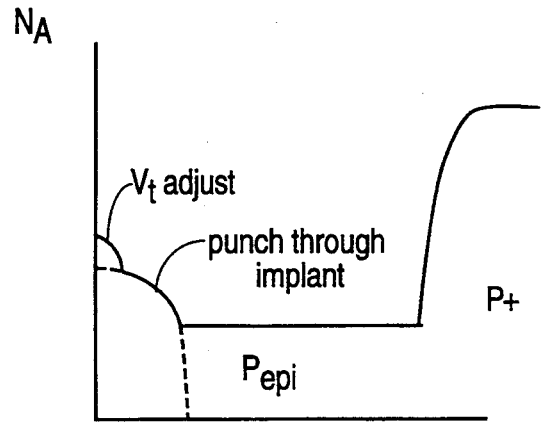
Figure 9:
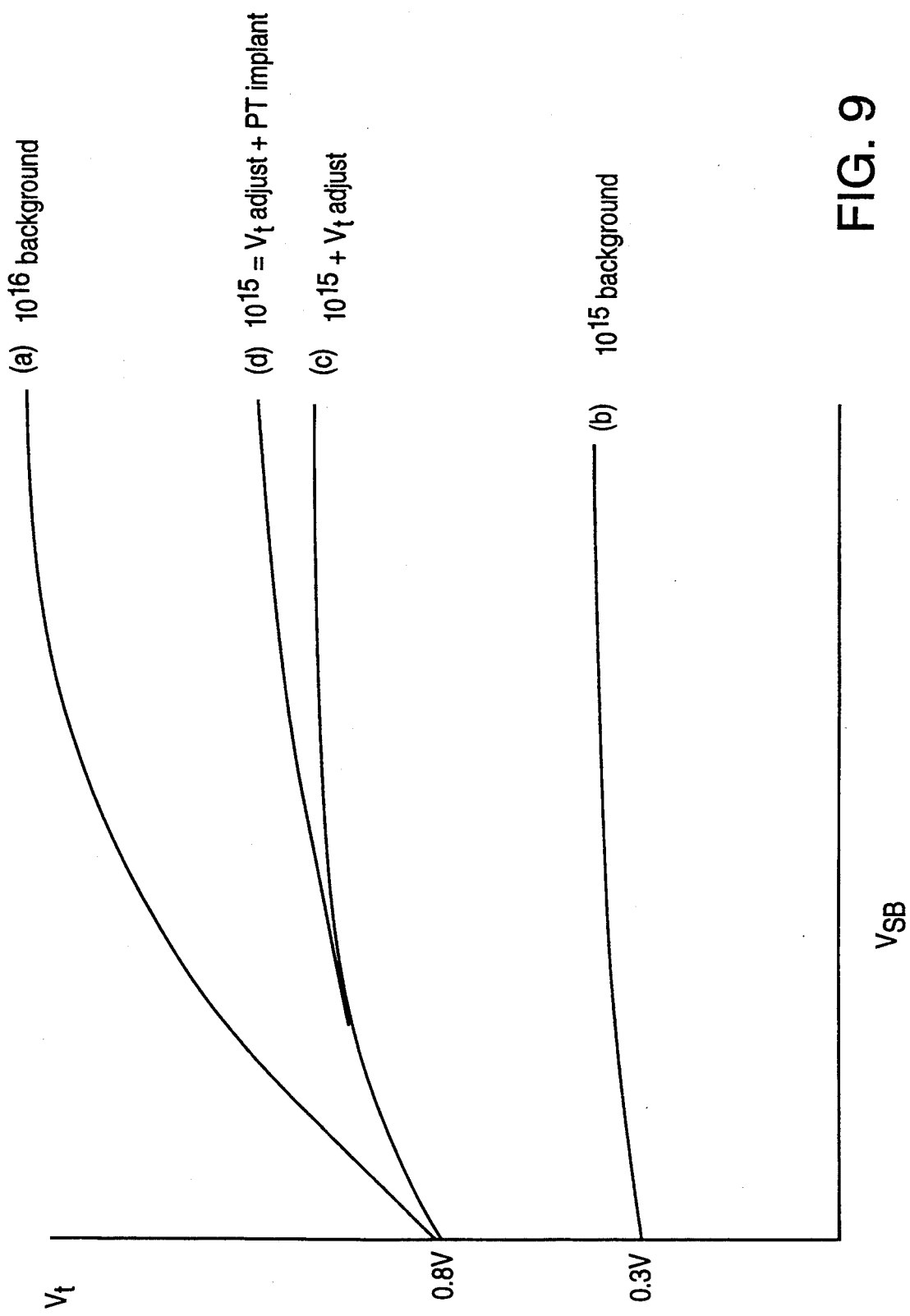
FIG. 9 illustrates relationships between threshold voltage and source-to-body voltage for the doping profiles of FIGS. 8A–8D, respectively.
Figure 10:
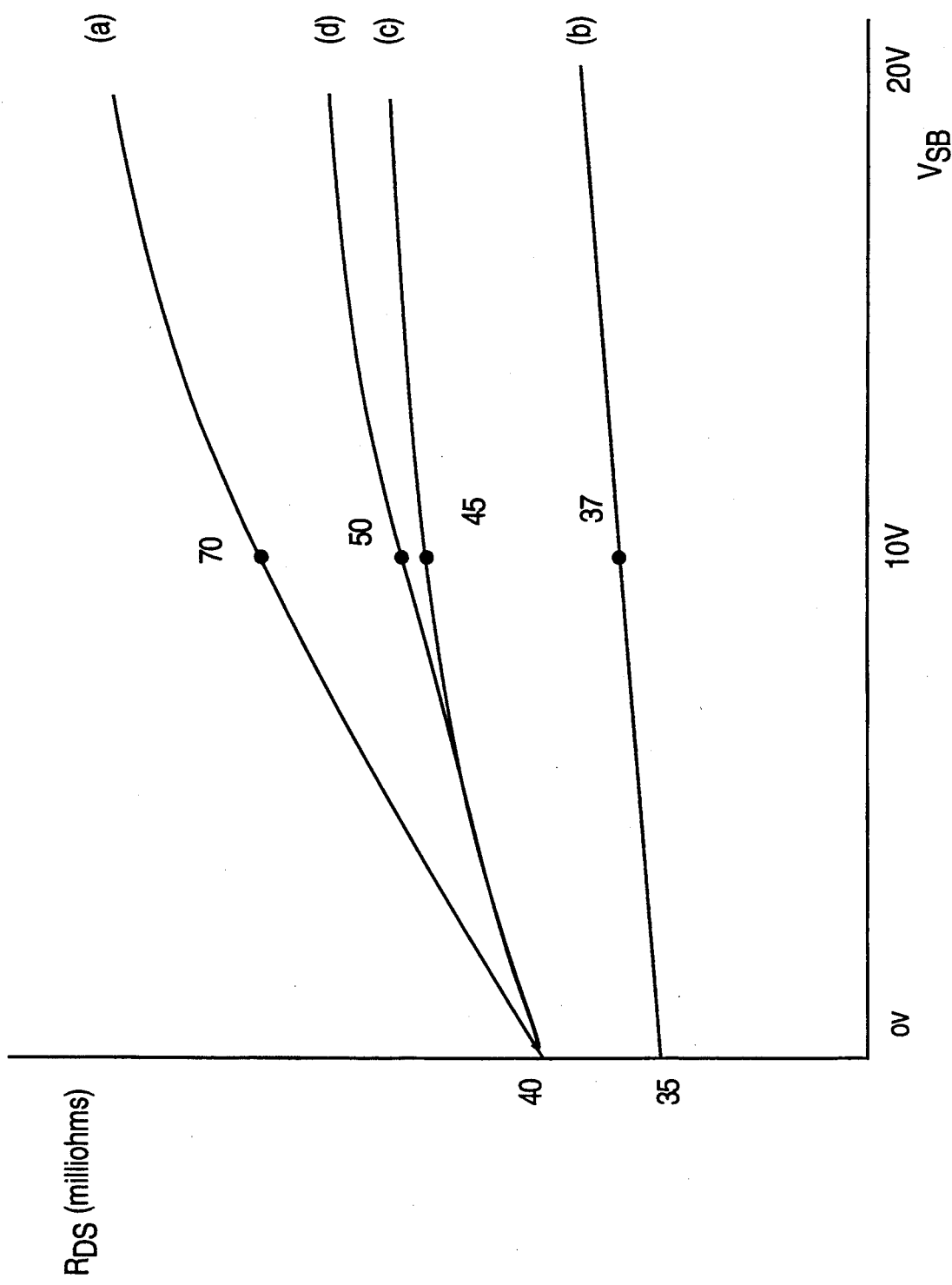
FIG. 10 illustrates the on-resistances as a function of the source-to-drain voltage for devices characterized by the doping profiles of FIGS. 8A–8D.

FIGS. 8A–8D, FIG. 9 and FIG. 10 illustrate the effect of threshold adjust implant layer 740 in accordance with the present invention. In FIGS. 8A–8D, the horizontal axis indicates a depth into P− epi layer 712 and body region 711, and the vertical axis indicates doping concentrations. As indicated in each of the FIGS. 8A–8D, the P type doping concentration increases dramatically at the boundary between epi region 712 and P+ body region 711. FIG. 9 shows the threshold voltage $V_t$ (vertical axis) as a function of source-to-body voltage $V_{sb}$ (horizontal axis). Curves (a), (b), (c) and (d) of FIG. 9 show the relationship for the dopant profiles illustrated in FIGS. 8A, 8B, 8C and 8D, respectively. FIG. 10 shows on-resistance $R_{ds}$ (vertical axis) as a function of source-to-body voltage $V_{sb}$ (horizontal axis). Curves (a), (b), (c) and (d) of FIG. 10 show the relationship for the dopant profiles illustrated in FIGS. 8A, 8B, 8C and 8D, respectively. The important consideration in FIG. 10 is the value of $R_{ds}$ when $V_{ds}$ is at a voltage at which a body effect is generated, and is typically evaluated at a Vsb equal to 10 volts.

FIG. 8A illustrates a doping profile for a first MOSFET having a epi region doping concentration of approximately $10^{16}$ ions/cm$^3$, which is selected to obtain a desired threshold voltage $V_t$ of 0.8 volts. As illustrated in curve (a) of FIG. 9, the threshold voltage $V_t$ is appropriately 0.8 volts when $V_{sb}$ equals 0 volts, but as $V_{sb}$ increases, the threshold voltage $V_t$ increases dramatically due to the body effect $\gamma$. As such, a MOSFET having a doping profile indicated in FIG. 8A has a large body effect $\gamma$, and therefore has a high on-resistance $R_{ds}$ as $V_{sb}$ increases, as shown in curve (a) of FIG. 10. Namely, as $V_{sb}$ is varied from 0 to 10 volts, $R_{ds}$ increases dramatically from 40 to 70 mΩ.

FIG. 8B illustrates a doping profile for a MOSFET in which the epi region doping concentration is reduced, thereby reducing the large body effect $\gamma$ exhibited in the MOSFET of FIG. 8A and increasing the conductance through the channel region. As shown, the doping concentration of the epi region is reduced to approximately $10^{15}$ ions/cm$^3$. Curve (b) in FIG. 9 indicates that the threshold voltage $V_t$ remains substantially constant for all values of $V_{sb}$, resulting in the relatively constant on-resistance $R_{ds}$ shown in curve (b) of FIG. 10. However, a problem is created because the threshold voltage V, is approximately 0.3 volts. The resulting MOSFET exhibits a reduced breakdown voltage and increased channel leakage due to source-to-drain punchthrough. It is noted that simply increasing the thickness of the gate oxide $X_{ox}$ may increase the breakdown voltage and decrease the punchthrough; however, this is undesirable because it would increase the on-resistance $R_{ds}$ of the MOSFET because $R_{ds}$ is also proportional to $X_{ox}$ (or inversely proportional to $C_{ox}$ as supported by Equation 1, above).

FIG. 8C illustrates doping profile for a MOSFET including a epi region doping level of approximately $10^{15}$ ions/cm$^3$, and including a thin threshold adjust region having a doping concentration of approximately $10^{16}$ ions/cm$^3$ and formed to a depth of 0.5 μm. As indicated in curve (c) of FIG. 9, the threshold voltage $V_t$ is at the desired 0.8 volts when $V_{sb}$ is 0 volts, and it increases only a small amount for increasing values of $V_{sb}$. The fact that the threshold voltage $V_t$ remains substantially constant indicates that the body effect $\gamma$ (Eq. 1) and the on-resistance $R_{ds}$ (Eq. 3) are reduced as compared with the MOSFET having the doping profile of FIG. 8A. Curve (c) in FIG. 10 confirms that $R_{ds}$ is reduced to 45 mΩ at a $V_{sb}$ of 10 volts, which is approximately 40% lower than the 70 mΩ associated with curve (a). In addition, the breakdown voltage and channel leakage problems associated with the MOSFET of FIG. 8B are avoided.

FIG. 8D illustrates doping profile for a MOSFET including a epi region doping level of approximately $10^{15}$ ions/cm$^3$, a thin threshold adjust region having a doping concentration of approximately $10^{16}$ ions/cm$^3$ as used in the MOSFET of FIG. 8C, and a punchthrough implant layer having a doping concentration of $5\times10^{15}$ cm$^{-3}$ and formed to a depth of 0.7 μm. As shown in curve (d) of FIG. 9, the threshold voltage $V_t$ is slightly higher at high source-to-body voltages $V_{sb}$ than in the embodiment of FIG. 8C. Similarly, curve (d) of FIG. 10 shows a slightly higher on-resistance $R_{ds}$ than the embodiment of FIG. 8C.

In addition to on-resistance considerations, suppression of the parasitic NPN bipolar transistor 770 (FIG. 7) is also important. The problem presented by the parasitic bipolar transistor 770 is that it may prevent device turn-off leading to possible current filamentation and permanent damage to MOSFET 700.

Figure 11:
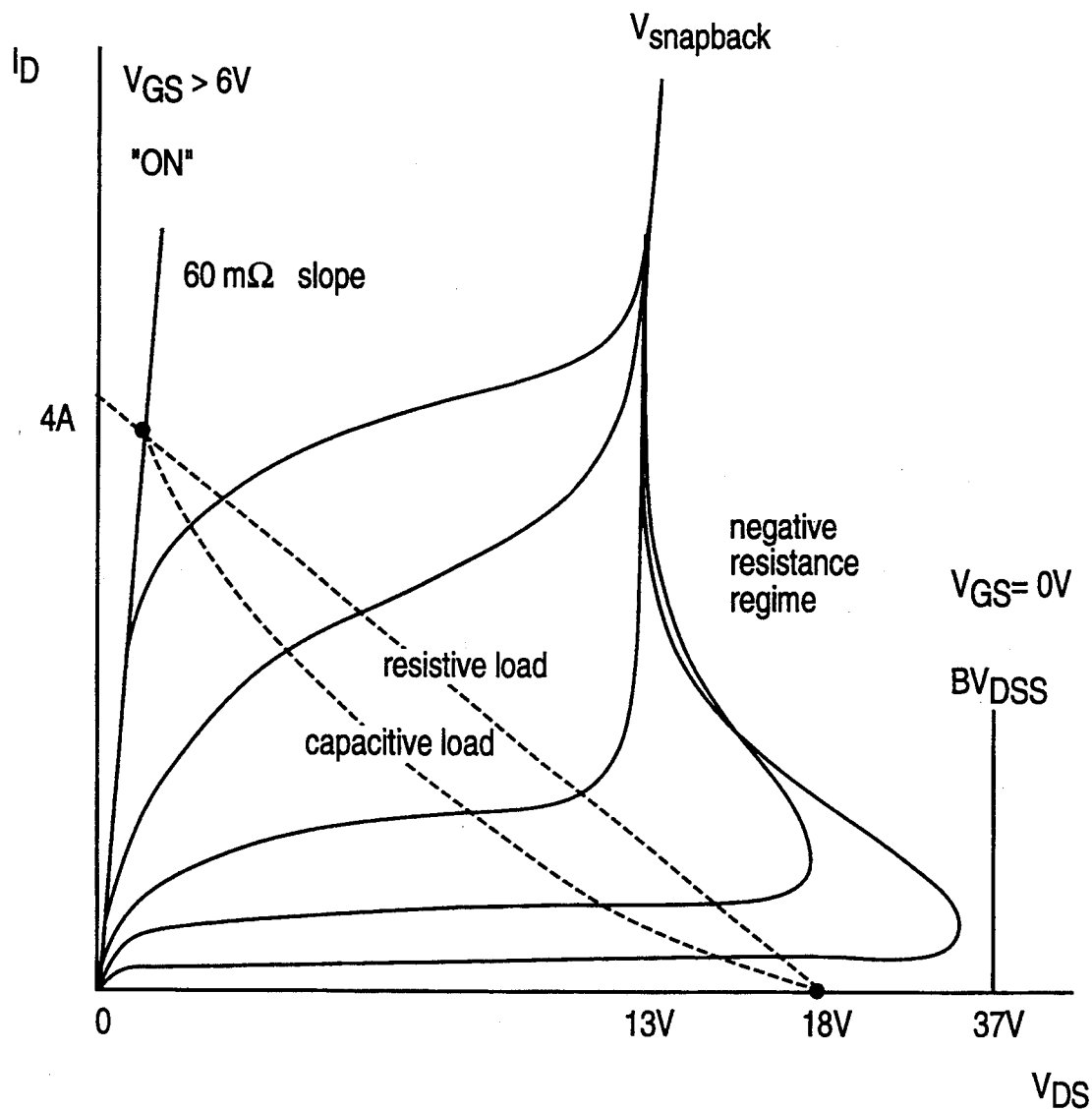
FIG. 11 illustrates snapback characteristics of a bidirectional MOSFET in accordance with the present invention.

FIG. 11 shows drain current $I_D$ as a function of drain-to-source voltage $V_{ds}$ for MOSFET 700, with the curves indicating characteristic responses for various gate voltages $V_{gs}$ between 0 and 6 volts. The limiting cases shown in FIG. 11 are a large $V_{gs}$ (that is, $V_{gs}$ greater than 6 volts), and the breakdown voltage $BV_{dss}$ of the device, i.e., current flow occurs even though $V_{gs}$ equals 0 volts. During $V_{gs}$ transitions between 0 and 6 volts or more, such as when a gate voltage is connected or disconnected, MOSFET 700 operates in the region shown in FIG. 11. In addition, the type of load applied to MOSFET 700 influences the relationship between $I_D$ and $V_{ds}$ during this transition period. As indicated by the straight, dotted diagonal line, a resistance load makes a linear transition while a capacitive load, indicated by the curved, dotted line, has a concave I-V characteristic. As long as the voltage of the supply is not too large, this transition can be made without passing into the negative resistance regime, discussed below. Notice because the capacitive curve produces large currents only at the small $V_{ds}$ portion of the transition, the load line curves away from the negative resistance regime, thereby allowing a larger voltage rating. An inductive load has the opposite effect and should be avoided in high voltage conditions of the disconnect switch.

Referring again to FIG. 11, the operation of parasitic NPN transistor 770 leading to "snapback" operation of MOSFET 700 occurs when the combination of load, $I_D$ and $V_{ds}$ causes MOSFET 700 to operate in the negative resistance regime. The phenomena is known as snapback because, when it occurs, an increase of $I_D$ results in a decrease in $V_{ds}$—i.e., negative resistance occurs. Eventually at some current density the voltage stabilizes (normally at a value far below the $BV_{dss}$ breakdown of the MOSFET). If the device is operated substantially below the snapback voltage (shown to be 13 volts in FIG. 11), the influence of the bipolar substrate currents will not affect operation, particularly for resistive and capacitive loads. For inductive loads, as long as the circuit clamps the inductive flyback voltage below $V_{snapback}$, direct control of inductive loads is also possible. If the supply voltage or maximum unclamped inductor voltage exceeds the snapback voltage, the device may be driven into snapback, reach excessive currents and destroy itself. The mechanism of snapback is one where during a transition from on-to-off or off-to-on, the device must pass through the saturation (or constant current) region where both current and voltage are simultaneously present in the device. The carriers in the saturated channel become very energetic and knock loose more carriers. Unlike avalanche, these carriers immediately are swept away by the high E-field. The holes flow to ground and create voltage drops in the substrate, normally more in some cells than in others. Eventually the source potential (which is more negative than the drain potential) also becomes more negative than the substrate due to these local IR drops and the diode forward biases. MOSFET 700 has now become an unevenly conducting bipolar transistor. The injected electrons fuel the impact ionization process, producing more substrate current, more forward injection, ad infinitum. The voltage then decreases to the sustaining voltage of parasitic bipolar transistor 770. The voltage stabilizes because the local current density becomes too high to support a high gain in the bipolar and the current gain declines.

Snapback sets further restrictions on the operational range of MOSFET 770. To increase the bipolar sustaining voltage, an increase in the gate length Lg (FIG. 7) of the MOSFET 700 is required which results in an unacceptable increase in on-resistance due to more channel resistance. Local lifetime control (where recombination centers and defects are introduced through irradiation) may also increase the bipolar sustaining voltage, depending on radiation dose and anneal processes used, but can adversely affect other devices in an integrated circuit. Another approach is to prevent the bipolar transistor 770 from turning on by minimizing the source-to-drain voltage $V_{ds}$ using a heavily doped substrate. But aside from using a thin epitaxial layer and heavily doped substrate, the bipolar sustaining voltage is difficult to alter without adversely effecting the performance of the MOSFET.

An alternative to altering the MOSFET structure to avoid problems presented by the parasitic transistor 770 is to restrict the use of the MOSFET to high capacity loads to insure that the gate voltage drops rapidly in comparison to the source voltage. In other words, if an adequate capacitance is present on the load, the gate-to-source voltage will change instantly, as will the drain current, without $V_{ds}$ changing. This operation keeps the device from sustaining large currents while supporting high voltages; thereby preventing large substrate currents which activate the parasitic bipolar transistor. The capacitance increases current spikes during turn-on but these spikes do not adversely effect the device like the turn-off condition can.

Production Method

Figure 12:
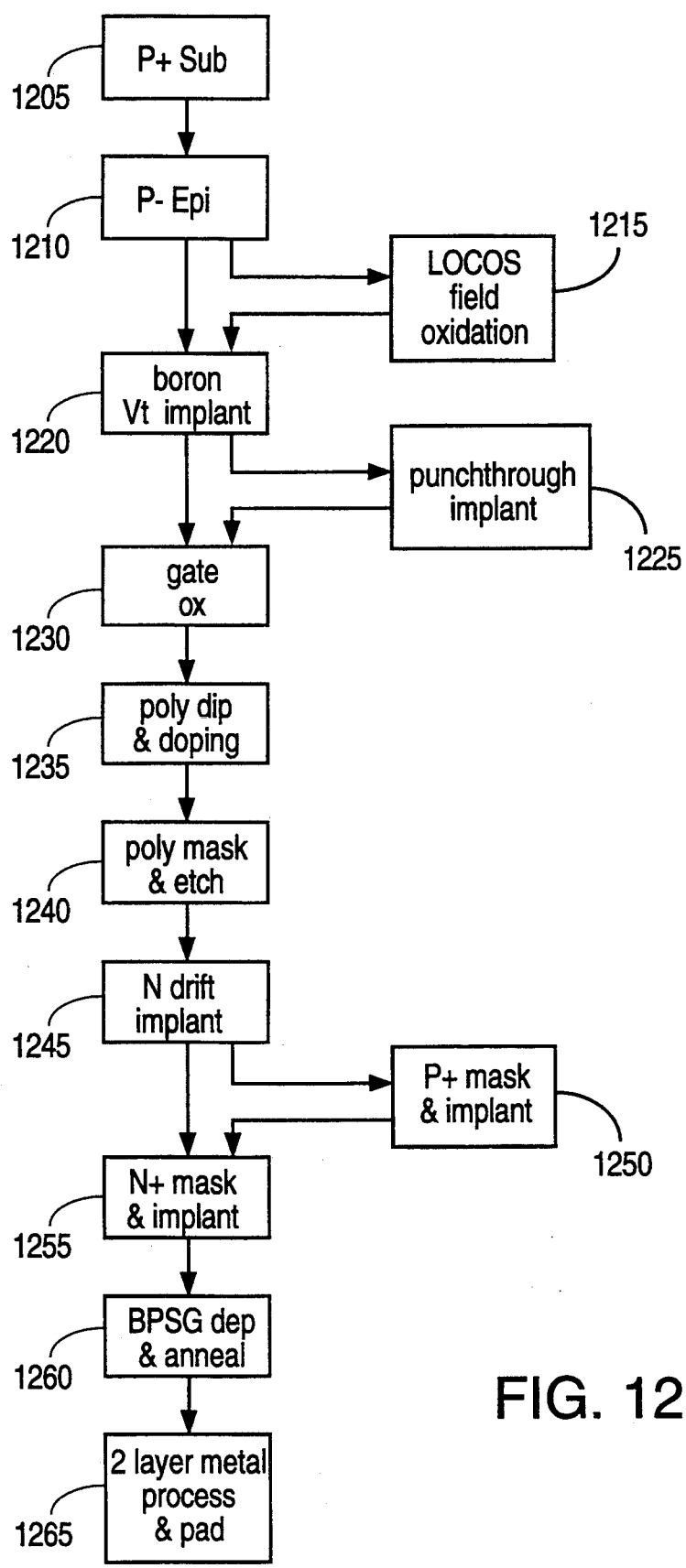
FIG. 12 illustrates a process flow diagram indicating process steps for making a bidirectional MOSFET in accordance with the present invention.

FIG. 12 illustrates a process flow diagram showing the process steps for fabricating the bidirectional blocking MOSFET 700 in accordance with the present invention. In FIG. 12, process steps associated with a preferred process are aligned in a column along the left side of the sheet, and additional steps (1215, 1225 and 1250) associated with MOSFET including topside body contacts are located to the right of the simplified process flow steps.

Referring to FIG. 12, step 1205 shows that fabrication begins with the P+ substrate 710 (FIG. 7), which as described above preferably has a (100) orientation and a resistivity below 0.03 ohm-cm. In step 1210, the P− epitaxial layer 712 is formed on the P+ substrate 710 using known techniques.

Following the formation of the epi layer 712, optional step 1215 is provided in which a field oxide is grown and etched to define active device areas, or a full LOCOS (local oxidation of silicon process) with a nitride layer to is employed to locally prevent oxidation in regions to be active. These techniques are well known in the art.

After the optional field oxide formation step 1215 (if used) or the epi formation step 1210, in step 1220 a boron implant is carried out on the surface of the epi layer 712. This produces the threshold adjust implant 740 which, as described above, is used to adjust the threshold voltage and to prevent punchthrough. Further, the threshold adjust suppresses the parasitic bipolar transistor 770 (FIG. 7) by increasing the charge in the base (channel) of the device and reducing depletion spreading into the channel thereby widening the base and lowering the gain. The field oxide formed in optional step 1215 prevents the threshold adjust implant from entering into non-active device areas, although the field oxide may be chosen to allow the threshold adjust implant to penetrate to act as a field implant to prevent channel formation (inversion) under the field oxide. The threshold adjust implant adds to background doping to raise the P concentration above that of the epi layer 712. Typical threshold adjust implants range from $3 \times 10^{11}$ cm$^{-2}$ to $4 \times 10^{12}$ cm$^{-2}$. The threshold adjust implant process is performed at energies from 60 to 150 keV using a 400 Å pre-implant implant oxide to prevent surface damage and implant channeling. The threshold adjust implant is intentionally sufficiently shallow to avoid a large increase in body effect.

As indicated by step 1225, if the doping of the epi layer 712 is sufficiently low, an additional boron implant is added to prevent punchthrough. The punchthrough implant is in the $5 \times 10^{11}$ to $5 \times 10^{12}$ cm$^{-2}$ range, depending on the desired on-resistance, although implants as high as $1 \times 10^{13}$ cm$^{-2}$ may be possible. The punchthrough implant is performed at energies from between 100 to 200 keV.

When the optional step 1215 is used, it will be required to form the threshold adjust and punchthrough implants through a 2000 Å LOCOS field oxidation. In this situation, higher implant energies are required to penetrate the fields which are typically 50 to 100 keV higher than the above-mentioned process energies.

Next, in step 1230, gate oxidation is performed, followed by poly gate formation step 1235. Poly gate formation involves depositing a polysilicon layer using well known techniques to a thickness of between 2000 Å and 8000 Å depending upon the maximum gate-to-source voltage (as described above), followed by doping the poly with an N+ dopant using either ion implantation or more preferably using POCl$_3$ pre-deposition. After doping, in step 1240, the poly is patterned and etched into a stripe or preferably a waffle-like pattern.

In step 1245, a blanket phosphorus (drift) implant is performed to implant the drift regions 722 and 732 (see FIG. 7). The drift implant dose must be higher than a normal implant to compensate for the threshold adjust. The drift implant doses range from $1 \times 10^{12}$ cm$^{-2}$ to $7 \times 10^{12}$ cm$^{-2}$, with $5 \times 10^{12}$ cm$^{-2}$ being a preferable value The drift implant step 1245 is then followed by step 1255 in which a photoresist mask is used to delineate the N+ regions 721 and 731 (FIG. 7) of the source 720 and the drain 730 formed using implant doses of between $3.5 \times 10^{15}$ and $1.0 \times 10^{16}$ cm$^{-2}$. An optional step 1250 may be included in which a separate P+ mask and boron implant is performed prior to or after step 1255 to define a topside body contact diffusion using a boron implant of 20 to 80 KeV and a dose of $5 \times 10^{14}$ to $8 \times 10^{15}$ cm$^{-2}$. In general, however, step 1250 is not needed and may even be undesirable because topside contact to the body may induce nonuniform substrate currents.

Next, in step 1260, the drift implants are annealed for 10 to 20 minutes at 900° to 1000° C., followed by PSG or BPSG glass deposition and glass flow followed by an additional thermal cycle in the 10 to 20 min range. Alternatively, the glass flow can be used to anneal the drift implants without the additional thermal cycle. By minimizing the thermal budget (that is, the total time at high temperatures), the threshold adjust implant and optional punchthrough implant remain localized, which is desired.

Finally, in step 1265, a 5-mask two-layer metal interconnect and passivation process is performed including a contact mask etch step, a first metal deposition, interlayer dielectric deposition, via etch (second) metal deposition, passivation deposition (SiN or glass) and pad mask etch. Step 1265 is well known in the art.

The foregoing examples are intended to be illustrative and not limiting. Many additional and alternative embodiments according to this invention will be apparent to those skilled in the art. All such embodiments are intended to be covered within the scope of this invention, as defined in the following claims.

I claim:

1. A method for reducing the on-resistance of a bidirectional current blocking power MOSFET, the bidirectional current blocking power MOSFET including a semiconductor substrate, the substrate including a body region doped with P-type dopant to a first doping concentration, wherein the body region is grounded and neither a source region nor a drain region of the power MOSFET is grounded, the method comprising:

forming a P-type spitaxial layer having a second doping concentration in the semiconductor substrate, the second doping concentration being lower than the first doping concentration;

introducing N-type dopant into the P-type epitaxial layer to form the source region and the drain region; and forming a P-type threshold adjust layer having a third doping concentration in the spitaxial layer, the third doping concentration being higher than the second doping concentration.

2. The method of claim 1 wherein the step of forming the P-type threshold adjust layer comprises forming a threshold adjust implant having a fourth doping concentration, and forming a punchthrough implant having a fifth doping concentration, wherein the fourth doping concentration is greater than the fifth doping concentration.

3. The method of claim 2 wherein the step of forming the threshold adjust implant comprises forming the threshold adjust implant to a first depth into the substrate, and the step of forming the punchthrough implant comprises forming the punchthrough implant to a second depth into the substrate, wherein the second depth is greater than the first depth.

4. The method of claim 3 wherein the power MOSFET is activated by a gate drive voltage applied between a gate and one of the source region and the drain region, and wherein the method further comprises the step of depositing an oxide layer on the substrate over the source and drain regions such that the oxide layer is formed to a minimum thickness necessary to support the gate drive voltage.

5. The method of claim 1 comprising the additional step of introducing N-type dopant to a region of the spitaxial layer adjacent the source region to form a first drift region, a concentration of N-type dopant in the first drift region being lower than a concentration of N-type dopant in the source region.

6. The method of claim 5 comprising the additional step of introducing N-type dopant to a region of the spitaxial layer adjacent the drain region to form a second drift region, a concentration of N-type dopant in the second drift region being lower than a concentration of N-type dopant in the drain region.

7. The method of claim 5 wherein the first drift region is formed by implanting N-type dopant at a dosage of from $1 \times 10^{12}$ to $7 \times 10^{12}$ cm$^{-2}$.

8. The method of claim 5 wherein the source region is formed by implanting N-type dopant at a dosage of from $3.5 \times 10^{15}$ to $1.0 \times 10^{16}$ cm$^{-2}$.

* * * * *

UNITED STATES PATENT AND TRADEMARK OFFICE
CERTIFICATE OF CORRECTION

PATENT NO.   : 5,451,533
DATED        : September 19, 1995
INVENTOR(S)  : Williams et al.

It is certified that error appears in the above-identified patent and that said Letters Patent is hereby corrected as shown below:

Col. 1, line 9, delete "APPLICATION" and insert --APPLICATIONS--.

Col. 6, line 16, delete "V,b" and insert --$V_{sb}$--.

Col. 6, line 49, delete "$10^{-9}$" and insert --$10^{-19}$--.

Col. 11, line 49, delete "spitaxial" and insert --epitaxial--.

Col. 12, line 7; col. 12, line 34; and col. 12, line 40 delete "spitaxial" and insert --epitaxial--.

Signed and Sealed this

Ninth Day of July, 1996

*Attest:*

BRUCE LEHMAN

*Attesting Officer*   Commissioner of Patents and Trademarks